US00RE38083E

(19) United States
(12) Reissued Patent
Ashe

(10) Patent Number: US RE38,083 E
(45) Date of Reissued Patent: Apr. 22, 2003

(54) RAIL-TO-RAIL DAC DRIVE CIRCUIT

(75) Inventor: James J. Ashe, Saratoga, CA (US)

(73) Assignee: Analog Devices, Inc., Norwood, MA (US)

(21) Appl. No.: 09/434,506

(22) Filed: Nov. 4, 1999

Related U.S. Patent Documents

Reissue of:
(64) Patent No.: 5,684,481
Issued: Nov. 4, 1997
Appl. No.: 08/436,024
Filed: May 5, 1995

U.S. Applications:
(63) Continuation-in-part of application No. 08/210,618, filed on Mar. 18, 1994, now abandoned.

(51) Int. Cl.[7] ..... H03M 1/18
(52) U.S. Cl. ..... 341/139; 341/154
(58) Field of Search ..... 341/139, 154, 341/144

(56) References Cited

U.S. PATENT DOCUMENTS

| | | | | | |
|---|---|---|---|---|---|
| 3,495,235 | A | | 2/1970 | Ottesen | 140/347 |
| 4,126,853 | A | * | 11/1978 | Frerking | 341/138 |
| 4,146,882 | A | * | 3/1979 | Hoff et al. | 341/118 |
| 4,544,912 | A | | 10/1985 | Iwamoto et al. | 340/347 AD |
| 4,623,983 | A | * | 11/1986 | Meguerdichian | 341/144 |
| 4,808,998 | A | * | 2/1989 | Yamada | 341/118 |
| 4,851,842 | A | * | 7/1989 | Iwamatsu | 330/144 |
| 4,866,261 | A | | 9/1989 | Pace | |
| 4,873,525 | A | | 10/1989 | Toshiba | |
| 4,891,645 | A | * | 1/1990 | Lewis et al. | 341/127 |
| 4,910,515 | A | | 3/1990 | Iwamatsu | 341/110 |
| 4,973,979 | A | | 11/1990 | Ikeda | |
| 4,978,959 | A | | 12/1990 | Chong et al. | |
| 4,990,916 | A | * | 2/1991 | Wynne et al. | 341/136 |
| 5,010,337 | A | * | 4/1991 | Hisano et al. | 341/119 |
| 5,119,095 | A | * | 6/1992 | Asazawa | 341/118 |
| 5,126,740 | A | | 6/1992 | Kawada | 341/144 |
| 5,212,482 | A | | 5/1993 | Okuyama | |
| 5,270,715 | A | * | 12/1993 | Kano | 341/139 |
| 5,278,558 | A | * | 1/1994 | Roth | 341/118 |
| 5,302,951 | A | * | 4/1994 | Yamashita | 341/118 |
| 5,396,245 | A | | 3/1995 | Rempfer | 341/145 |
| 5,422,643 | A | * | 6/1995 | Chu et al. | 341/139 |

FOREIGN PATENT DOCUMENTS

| | | | | |
|---|---|---|---|---|
| EP | 0329148 | * | 8/1989 | |
| EP | 0625827 B1 | | 11/1994 | H03M/1/74 |
| JP | 56-141620 | * | 11/1981 | |
| JP | 561668428 | | 12/1981 | H03K/13/05 |
| JP | 57-104320 | * | 6/1982 | |
| JP | 58079331 | | 5/1983 | H03K/13/05 |
| JP | 60-263525 | * | 12/1985 | |
| JP | 61263325 | | 11/1986 | H03K/13/05 |
| JP | 63-209847 | | 9/1988 | H03M/1/78 |
| JP | 258429 | * | 2/1990 | |
| WO | WO 9210034 | | 6/1992 | H03M/1/16 |

OTHER PUBLICATIONS

"MAXIM Low–Cost, Triple, 8–Bit Voltage–Output DACs with Serial Interface", Apr. 1994.

(List continued on next page.)

*Primary Examiner*—Peguy JeanPierre
(74) *Attorney, Agent, or Firm*—Koppel, Jacobs, Patrick & Heybl

(57) ABSTRACT

A voltage mode digital-to-analog converter (DAC) with an output buffer operational amplifier is provided with a rail-to-rail output voltage capability by reducing the DAC's output voltage swing to a range that is within the amplifier's permissible input signal range, and connecting the amplifier in a multiplier configuration to produce a corresponding multiplication of its input signal. The DAC output reduction is preferably achieved by delivering an n-bit input digital signal to an n+m bit DAC, and holding the DAC's m most significant bits OFF. The m most significant bits are dummy bits that are impedance matched with the DAC, while the amplifier is an operational amplifier with a feedback circuit that is also impedance matched to the DAC.

42 Claims, 2 Drawing Sheets

OTHER PUBLICATIONS

National Semiconductor Corporation, *Linear Databook National Semiconductor*, 1982, pp. 8–28—8–59, 8–89—8–96, 8–133—8–150, National Semiconductor Corporation, Santa Clara, CA.
National Semiconductor Corporation, *Linear Data Book National Semiconductor*, 1980, pp. 8–10—8–44, 8–92—8–123, National Semiconductor Corporation, Santa Clara, CA.
National Semiconductor Corporation, *1984 Linear Supplement Databook National Semiconductor Corporation*, 1984, pp. S5–12—S5–27, S5–36—S5–77, S–104—S5–136, National Semiconductor Corporation, Santa Clara, CA.
Phil Burton, *CMOS DAC Application Guide, Third Edition*, 1984, pp. 13–22, 27–35, Analog Devices, Inc.
"Analog—Digital Conversion Notes," 1977, Edited by Danield Sheingold, pp. 115–121, 143–149, 156–161.
"Analog–Digital Conversion Handbook," Third Edition, 1986, Edited by Danield Sheingold, pp. 113–116, 122–124, 199–212, 224–235, 250, 490–494, 605–614, Analog Devices, Inc.
Sony, *Data Book 1993 A/D, D/A Converters*, 1993, pp. 117–155, Sony.
Micro Power Systems, *Micro Power Systems Inc. Data Conversion Products Data Book*, 1992, pp. 3–205—3–208, 4–7—4–14, 4–59—4–68, 4–139—4–141, 4–229—4–237, 7–1—7–8, 7–17—7–51, Micro Power Systems, Santa Clara, CA.
National Semiconductor Corporation, *Linear Applications Handbook*, 1978 pp. AN48–1—AN48–4, National Semiconductor, Santa Clara, CA.
ADI 1989/90 Conversion Produts Databook, $LC^2$ MOS 12–BIT DACPORTS; Analog Devices 7245/Analog Devices 7248 2–221—2–234; Analog Devices 7840, $LC^2$ MOS 14–BIT DAC 2–329–2344.
John Fluke Manufacturing Company, Fluke—Instruction Manual—Model 332A Voltage Calibrator #434, 1966.
Tektronix—Oscilloscope Probe Circuits—Circuit Concept Series.
National Semiconductor, 3/84 national Semiconductor Application Note 344: LF13006/LF13007 Precision Digital Gain Set Applications, National Semiconductor, 1995.
National Semiconductor, 9/81 National Semiconductor Application Note 271: Applying the New CMOS MICRO–DACs, National Semiconductor, 1995.
National Semiconductor, 9/91 National Semiconductor Application Note 284: Single–Supply Application of CMOS MICRO–DACs, National Semiconductor, 1995.
National Semiconductor, 3/86 National Semiconductor Application Note 293: Control Applications of CMOS DACs, National Semiconductor, 1995.
McGraw Hill, Inc./Donald L. Schilling, Digital Integrated Electronics/McGraw Hill Books, 1977.
Michael M. Cirovic, 1977 Integrated Circuits/A User's Handbook, Reson Publishing Company, Inc., 1977.
Robert Mauro, 1989 Article: Engineering Electronics, Prentice Hall, 1989.
Analog Devices, Paper: Analog Devices DAC–8562.
Analog Devices, Paper: Analog Devices DAC–8512.
Daniel H. Sheingold, 1980 Transfer Interfacing Handbook, Analog Devices.
James Williams, Jul. 11, 1974 Electronics Engineer's Notebook.
John Fluke Manufacturing Company, AC/DC Differential Voltmeter, 1966.
James Williams & Nicholas Catsimpoolas, "A Highly Regulated, Recording Constant Power, Voltage, and Current Supplu for Electrophoresis and Isoelectric Focusing," Academic Press, 1976.
James Williams, "Designer's Guide to Temperature Measurement".
Julie Research Laboratories, Inc., 1970 Laboratory Manual for D.C. Measurement.
Bulletin: JRL Precision vol. 7 No. 3.
Bulletin H–3: Julie Research Laboratories (JRL).
Tektronix, Inc. Instruction Manual: Type W Plug–in Unit.
National Semiconductors, 8/81 National Semiconductor Application Note 269, 1981.
Willard L. Erickson and Chester V. Wells, 1968 Paper: Experimental Backgrounds for Electronic Instrumentation, Laboratory Systems Research Inc.
Analog Devices, 1989–90 Data Conversion Products Databook, Analog Devices.
1978 Paper: IC Schematic Sourcemaster, John Wiley & Sons, Inc.
National Semiconductor, 9/81 National Semiconductor Application Note 284: Single–Supply Applications of CMOS MICRO–DACs, National Semiconductor, 1995.
1976 ADI "Nonlinear Circuits Handbook".
1980 ADI "Transducer Interfacing Handbook".
1991 ADI "Mixed–Signal Design Seminar".
Analog—Digital Conversion Handbook, 1972 Edited by Daniel Sheingold.
CMOS DAC Applications guide $2^{nd}$ Edition, 1984 by Phil Burton.
CMOS DAC Applications Guide $3^{rd}$ Edition, 1984 by Phil Burton.
CMOS 16–Bit Multiplying DAC.
"World's First Monolithic 16–Bit D/A Converter" by Mike Tuthill and John Wynne, Analog Dialogue 16–1, 1982.
ADI News Release "Technical Details on the AD7546, The Industry's First Monolithic 16–Bit DAC", 1981.
Electronic Design "Voltage Output Monolithic DAC Resolves 16–Bits" by Mike Tuthill and John Wynne, 1981.
Application Guide to CMOS Multiplying D/A Converters, 1978, Edited by Daniel Sheingold.
16–Bit Monotonic Voltage Output D/A Converter AD569.
DACPORT 16–Bit DAC is 16–Bit Monotonic—All Grades & Temp Ranges Analog Dialogue 20–2, 1986.
DACPORT Low Cost Complete MP—Compatible 8–Bit DAC.
"Putting the AD558 DACPORT on the BUS" by Doug Grant, Analog Dialogue 14–2, 1980.
Application Note "Interfacing the AD558 DACPORT to Microporcessors" by Doug Grant 8/80.
Application Note "An Analysis of the Price and Performance of the AD558" by Gooloe Suttler.
1979 Data Acquisition Products Catalog Supplement.
1992 Data Converter Reference Manual vol. 1.
1992 Amplifier Applications Guide.
1982 Data Acquisition Databook 1982 Integrated Circuits.
1980 Data Acquisition Components and Subsystems.
1978 Data Acquisition Products Catalog.
1988 Data Conversion Products Databook.
1986 Data Acquisition Databook Update and Selection Guide.

1982–1983 Data Acquisition Databook Update and Selection Guide.
1984 Data Acquisition Databook, vol. 1—Integrated Circuits.
Analog Devices, Inc. Data Converter Reference Manual, vol. 1, 1992, pp. 2–267 through 2–278.*
National Semiconductor, AN–48 Applications for a New Ultra–High Speed Buffer 1971.
IEEE International Electronic Manufacturing Technology Symposium, Sep. 15–17, 1986, San Francisco, CA USA, IEEE 1986, pp. 254–260.
Electronic Design, Penton Publishing, Cleveland, OH USA, vol. 28, No. 19, Sep. 1980, pp. 111–114.
Electronics, Monolithic d–a Converter Operates on Single Supply, New York, USA vol. 53, No. 5, Feb. 1980, pp. 125–131.
Dennis M. Monticello, "A Quad CMOS Single–Supply Op Amp with Rail–to–Rail Output Swing," IEEE Journal of Solid–State Circuits, vol. SC–21, No. 6, Dec. 1986.
James L. McCreary and Paul R. Gray, "All–Mos Charge Re–distribution Analog–to–Digital Conversion Techniques—Part I," IEEE Journal of Solid–State Circuits, vol. SC–10, No. 6, Dec. 1975.
Gensuke Goto, et al., An NMOS Operational Amplifier for an Output Buffer of Analog LSI's IEEE Journal of Solid–State Circuits, vol. SC–17, No. 5, Oct. 1982.
Prabir C. Maulik, Nicholas van Bavel, Keith S. Albright, "An Analog/Digital Interface for Cellular Telephony," IEEE Journal of Solid–State Circuits, vol. 30, No. 3, Mar. 1995.
Roubik Gregorian, "A Continuously Variable Slope Adaptive Delta Modulation Codec System," IEEE Journal of Solid–State Circuits, vol. SC–18, No. 6, Dec. 1983.
Ira Miller, "A Custom Data Conversion Subsystem for Personal Computers," IEEE Journal of Solid–State Circuits, vol. SC–20, Apr. 1985.
KH Hadidi, Vincent S. Tao, Gabor C. Temes, "An 8–b 1.3–MHz Successive–Approximation A/D Converter," IEEE Journal of Solid–State Circuits, vol. 25, No. 3, Jun. 1990.
Horst L. Fiedler, et al., "A 5–Bit Building Block for 20 MHz A/D Converters," IEEE Journal of Solid–State Circuits, vol. SC–16, No. 3, Jun. 1981.
Hans–Ulrich Post and Karl Schoppe, "A 14 Bit Monotonic NMOS D/A Converter," IEEE Journal of Solid–State Circuits, vol. SC–18, No. 3, Jun. 1983.
John Fernandes, et al., "A 14–bit 10–$\mu$s Subranging A/D Converter with S/H," IEEE Journal of Solid–State Circuits, vol. 23, No. 6, Dec. 1988.
Bahram Fotouhi and David A. Hodges, "High Resolution A/D Conversion in MOS/LSI," IEEE Journal of Solid–State Circuits, vol. SC–14, No. 6, Dec. 1979.
John W. Yang and Kenneth W. Martin, "High–Resolution Low–Power CMOS D/A Converter," IEEE Journal of Solid–State Circuits, vol. 24, No. 5, Oct. 1989.
Thomas P. Redfern, Joseph J. Connolly, Jr., et al., "A Monolithic Charge–Balancing Successive Approximation A/D Technique," IEEE Journal of Solid–State Circuits, vol. SC–14, No. 6, Dec. 1979.
Richard K. Hester, et al., "A Monolithic Data Acquisition Channel," IEEE Journal of Solid–State Circuits, vol. SC–18, No. 1, Feb. 1983.
Matt Townsend and Marcian E. Hoff, Jr., "An NMOS Microprocessor for Analog Signal Processing," IEEE Journal of Solid–State Circuits, vol. SC–15, No. 1, Feb. 1980.
Marcian E. Hoff, Jr., "An NMOS Telephone Codec for Transmission and Switching Applications," IEEE Journal of Solid–State Circuits, vol. SC–14, No. 1, Feb. 1979.
James H. Atherton and H. Thomas Simmonds, "An Offset Reduction Technique for Use with CMOS Integrated Comparators and Amplifiers," IEEE Journal of Solid–State Circuits, vol. 27, No. 8, Aug. 1992.
Jen–Yen Huang, "Resistor termination in D/A and A/D Converters," IEEE Journal of Solid–State Circuits, vol. SC–15, No. 6, Dec. 1980.
Hae–Seung Lee, et al., "A Self Calibrating 15 Bit CMOS A/D Converter," IEEE Journal of Solid–State Circuits, vol. SC–19, No. 6, Dec. 1984.
Adib R. Hamade, "A single Chip All–Mos 8 Bit A/D Converter," IEEE Journal of Solid–State Circuits, vol. SC–13, No. 6, Dec. 1978.
Yoshiaki Kuraishi, et al., "A Single–Chip NMOS Analog Front– End LSI for Modems," IEEE Journal of Solid–State Circuits, vol. SC–17, No. 6, Dec. 1982.
Paul R. Gray, et al., "A Single–Chip NMOS Dual Channel Filter for PCM Telephony Applications," IEEE Journal of Solid–State Circuits, vol. SC–14, No. 6, Dec. 1979.
Yoshiaki Kuraishi et al., "A Single–Chip 20–Channel Speech Spectrum Analyzer Using a Multiplexed Switched–Capacitor Filter Bank," IEEE Journal of Solid–State Circuits, vol. SC–19, No. 6, Dec. 1984.
Kazuo Yamakido et al., "A Subscriber Digital Signal Processor LSI for PCM Applications," IEEE Journal of Solid–State Circuits, vol. 23, No. 3, Jun. 1988.
Marcel J.M. Pelgrom, "A 10–b 50–MHz CMOS D/A Converter with 75–Ω Buffer," IEEE Journal of Solid–State Circuits, vol. 25, No. 6, Dec. 1990.
Toshihiko Hamasaki, et al., "A 3–V, 22–mW Multibit Current–Mode ΣΔ DAC with 100 dB Dynamic Range," IEEE Journal of Solid–State Circuits, vol. 31, No. 12, Dec. 1996.
Andre Abrial, et al., "A 27–MHz Digital–to–Analog Video Processor," IEEE Journal of Solid–State Circuits, vol. 23, No. 6, Dec. 1988.
Harro Bruggemann, "Ultrafast Feedback A/D Conversion Made Possible by a Nonuniform Error Quantizer," IEEE Journal of Solid–State Circuits, vol. SC–18, No. 1, Feb. 1983.
DAC 8562 ADI Data Sheet.
Frederick G. Weiss, "A lGs/s 8–bit GaAs DAC with On–Chip Current Sources," XP002035880, IEEE, 1986.
Radio Fernsehen Electronik, VEB Berlag Technik Ost–Berlin, DDR, vol. 32, No. 7, 1983, p. 468.
Toute L. Electronique, Societe Des Editions Radio Paris, FR No. 506, Aug./Sep. 1985, pp. 94–99.
James Williams, *DC Differential Voltmeter Resolves 1 Microvolt, Engineer's Notebook*, Electronics/Jul. 11, 1974, pp. 116–118.
Jim Williams, *Simple Techniques Fine–Tune Sample–Hold Performance, Circuit Design*, Electronic Design Nov. 12, 1961, pp. 235–238.
John Fluke Mfg. Co., Inc., *Section III Theory of Operation*, Jun. 1, 1966, p. 3–1.
Joe Weber, *Oscilloscope Probe Circuits*, Teletronix, Inc., 1969, pp. 10, 28, 29 and 35.
Data Precision Corporation, *Instruction Manual for Model 8200 6½—Digit Voltage & Current Calibrator*, 1981, pp. 1–2 to 5–10 and drawings.

* cited by examiner

RAIL-TO-RAIL DAC DRIVE CIRCUIT

Matter enclosed in heavy brackets [ ] appears in the original patent but forms no part of this reissue specification; matter printed in italics indicates the additions made by reissue.

RELATED APPLICATION

This application is a continuation-in-part of Ser. No. 08/210,618, filed Mar. 18, 1994 *abandoned*.

BACKGROUND OF THE INVENTION

1. Field of the Invention

This invention relates to digital-to-analog converter (DAC) drive circuits, and particularly to DAC circuits that are connected to output operational amplifiers having a permissible input voltage range less than the circuit's rail-to-rail differential.

2. Description of the Related Art

DACs that are configured to operate in the voltage mode, in which an output analog voltage that corresponds to an input digital signal is produced, typically have their outputs buffered by an operational drive amplifier. This type of design is used, for example, in the PM-7224 8-bit CMOS DAC described in the Analog Devices, Inc. Data Converter Reference Manual, volume 1, 1992, pages 2–267 through 2–278.

The basic circuit is illustrated in FIG. 1. A voltage mode converter DAC1 is shown with its output 2 connected to the non-inverting input of a buffer operational amplifier A1. The output 4 of A1 is tied back to the amplifier's inverting input, thus providing a unity gain drive for a load 6.

A typical circuit used to implement amplifier A1 is shown in FIG. 2. The circuit is supplied by positive and negative voltage supply lines $V_{dd}$ and $V_{ss}$, respectively. The voltage supply levels are referred to as the circuit "rails". With $V_{ss}$ tied to analog ground potential, the circuit can be operated with a single power supply $V_{dd}$, typically 12–15 volts. The circuit could alternately be operated from dual power supplies, such as +5 and −5 volts for $V_{dd}$ and $V_{ss}$, respectively.

The amplifier's output stage is shown as an NPN bipolar transistor Q1 that provides a low-impedance, high-output current capability. The emitter of Q1 is loaded with a current source I1, such as a 400 microamp NMOS current source referenced to $V_{ss}$, while its collector is connected to $V_{dd}$. Sinking the I1 current into $V_{ss}$ allows the amplifier's output to go directly to ground.

An input stage consisting of [art] *an* NMOS transistor Q2 has its drain connected to $V_{dd}$, with another current source I2 sinking current from the source of Q2 to $V_{ss}$; the Q2 source is also connected through a resistor R1 to the base of Q1. Transistor Q2 operates as a source follower, driving the resistor R1 and output transistor Q1.

The converter DAC1 by itself is a high impedance device; the operational amplifier A1 provides a buffer function to drive the load. However, proper operation of A1 generally requires that its input 8 from the DAC be 1 volt or more below the positive voltage supply level $V_{dd}$. This means that the voltage swing at the output of the DAC must be limited to the permissible input voltage range for the amplifier, and consequently also limits the output range for the overall circuit to a similar level. The circuit is thus limited to an output range less than a desired "rail-to-rail" voltage swing.

SUMMARY OF THE INVENTION

The present invention seeks to provide an improved DAC drive circuit that is capable of operating in a voltage mode with a full rail-to-rail output range. This goal is accomplished by dividing the DAC output by a factor that places it within the permissible input range for the op amp, and providing the amplifier's output stage with a gain that allows the overall drive circuit to produce a rail-to-rail output if desired.

In a preferred embodiment the divider is implemented with an attenuation network, in the form of m dummy DAC bits, that is impedance matched to the DAC. The DAC, which is connected to receive an n-bit digital signal, thus has n+m bits. The dummy bits are connected as the DAC's m most significant bits, and are always OFF. This produces a downscaling of the input signal range by a factor $\frac{1}{2}^m$. The op amp is configured to produce a compensating $2^m$ amplification, and includes a feedback circuit that is also impedance matched to the DAC. By setting m equal to 1, the DAC's output range is divided by 2, with the op amp doubling the DAC's output to restore a rail-to-rail output swing.

These and other features and advantages of the invention will be apparent to those skilled in the art from the following detailed description, taken together with the accompanying drawings.

DETAILED DESCRIPTION OF THE INVENTION

Figure 1:
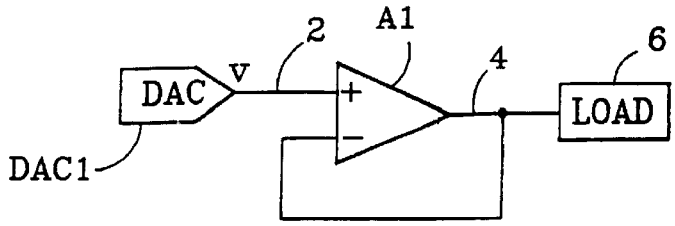
FIG. 1 (Prior Art)
FIG. 1 is a block diagram of a known voltage mode DAC drive circuit, described above.
Figure 2:
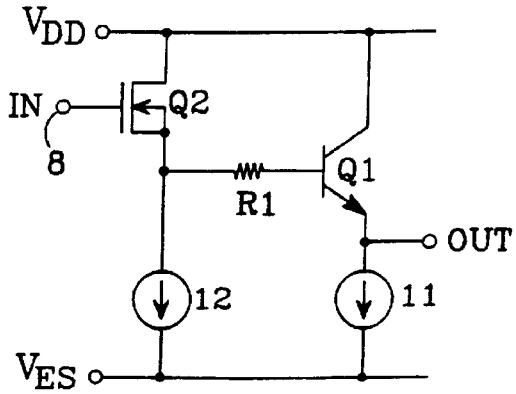
FIG. 2 (Prior Art)
FIG. 2 is a schematic diagram of a known operational amplifier, described above, used in the circuit of FIG. 1.
Figure 3:
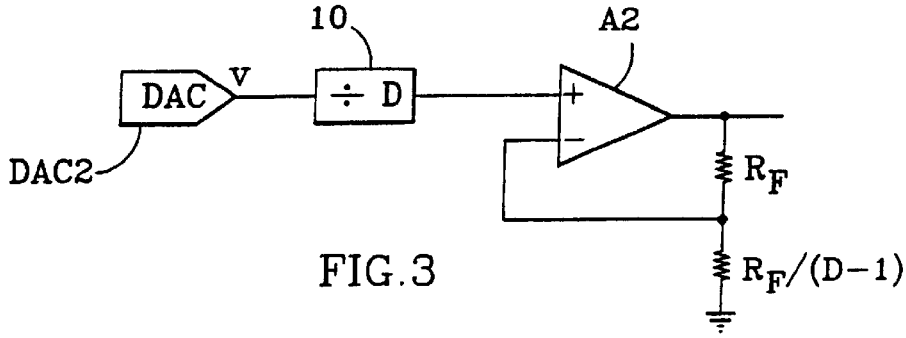
FIG. 3 is a block diagram illustrating the basic theory of the invention.

FIG. 3 presents a block diagram illustrating the inventive concept that enables a rail-to-rail output from a voltage mode DAC that drives an output buffer amplifier. The output of the DAC 2 is divided by a factor D in a divide block 10 before being applied to a buffer op amp A2, which is connected in a multiply configuration to amplify its input by a factor greater than unity. This allows the reference input for DAC 2 to be rail-to-rail, while the swing of the input to the op amp A2 is restricted to the rail-to-rail swing divided by D. With D set at a convenient value such as 2, the input to the op amp A2 will only swing from one rail half way to the other rail. The op amp's input stage can easily handle this voltage swing; providing it with an amplification factor of D results in the output from A2 as well as the input to DAC 2 being rail-to-rail. This amplification is achieved in the conventional manner by connecting a feedback resistor RF between the output and inverting input of A2, connecting a gain setting resistor $R_F/(D-1)$ between the A2 inverting input and ground, and connecting the non-inverting input of A2 to the DAC output.

Figure 4:
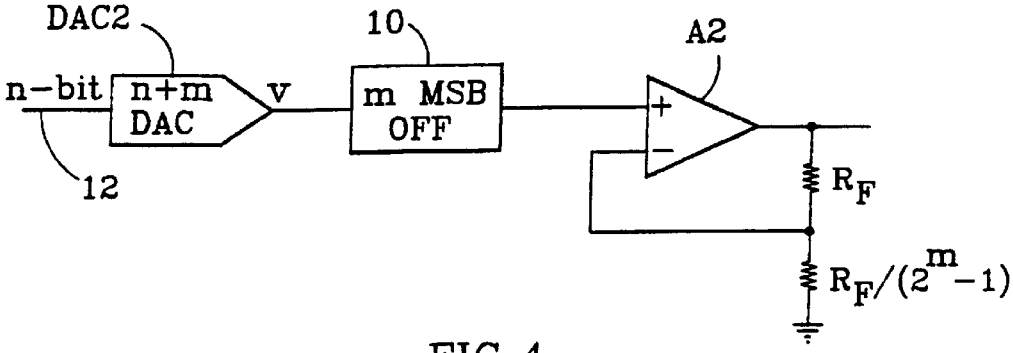
FIG. 4 is a block diagram showing an implementation of the invention with an n+m bit DAC that receives an n-bit digital input, and has its m most significant bits held OFF to serve a dummy function.

The division function is preferably [implementing] *implemented* by adding one or more dummy bits to the DAC as its most significant bits, and holding the dummy bits off continuously. While a single extra bit will divide the DAC's output by 2, which will normally be compatible with the op amp's input stage, the concept can be generalized as illustrated in FIG. 4 by applying an n-bit digital input 12 to DAC 2, which is implemented as an (n+m)-bit device. The division function 10 is accomplished by holding the m most significant bits OFF. This results in an input to the op amp A2 that has a voltage range equal to the rail-to-rail differential divided by $2^m$. A rail-to-rail output from A2 is achieved by setting the amplifier's gain setting resistor equal to $R_F/(2^m-1)$.

Figure 5:
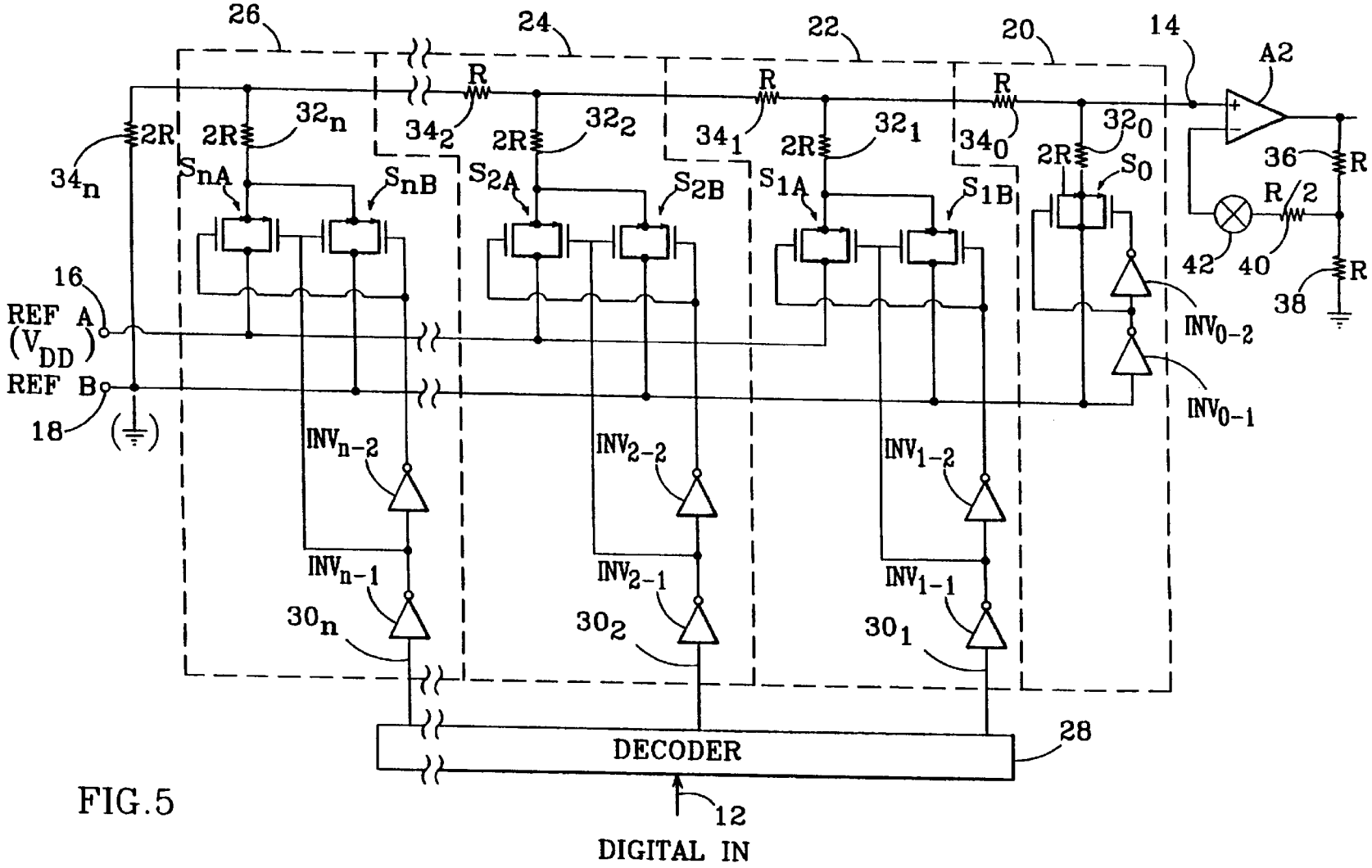
FIG. 5 is a simplified schematic diagram that provides additional circuit details of the FIG. 4 embodiment.

FIG. 5 is a simplified schematic diagram of a voltage mode DAC and the op amp A2 connected together as indicated in FIG. 4, with m=1. The illustrated DAC employs a conventional R-2R resistance ladder, but the invention is also applicable to other DAC voltage mode configurations.

The output from the resistor ladder is taken at node 14, which also provides the input to the output amplifier A2. Voltage references REF A and REF B are provided for the DAC at terminals 16 and 18, respectively. REF A is preferably set equal to the $V_{DD}$ upper rail value, while REF B is preferably set equal to ground or to the lower rail value if it is different from ground.

The DAC's three most significant bits (MSBs) are shown within dashed outlines 20, 22 and 24, while the least significant bit (LSB) is enclosed within dashed outline 26. The MSB 20 is actually an attenuation network that is impedance matched to the DAC and is used to divide the output from the DAC by two. This is accomplished by using the same R-2R configuration for bit 20 as for the other bits, but holding bit 20 constantly OFF regardless of the DAC's digital input signal.

A conventional decoder 28 receives the digital input signal either serially over a single input line 12 or as a parallel input over a number of input lines. The decoder provides switch control signals over decoder output lines $\mathbf{30}_1$, $\mathbf{30}_2$ . . . $\mathbf{30}_n$ to the various ladder stages except for the MSB 20. In this bit, the 2R resistor $\mathbf{32}_0$, is connected permanently to REF B. This holds the MSB in a continual OFF state to implement the divide-by-two function discussed above in connection with FIG. 4. With a permanent connection to analog ground, the MSB 20 divides the DAC output by 2.

The subsequent DAC bit stages 22, 24 . . . 26 are each implemented in a conventional manner, with R-value resistors $\mathbf{34}_1$, $\mathbf{34}_2$ . . . $\mathbf{34}_n$ connected in series with the DAC output 14 ($\mathbf{34}_n$ actually has a value of 2R to terminate the ladder), and 2R value resistors $\mathbf{32}_1$, $\mathbf{32}_2$ . . . $\mathbf{32}_n$ connected between respective pairs of R-value resistors and respective switching networks. The 2R resistors are connected to either REF A or REF B, depending upon the switch control signals from the decoder 28.

Referring first to the second MSB stage 22, the decoder output on line $\mathbf{30}_1$ is transmitted through a pair of series connected inverters $INV_{1-1}$ and $INV_{1-2}$. The 2R resistor $\mathbf{32}_1$ for the stage is connected to REF A through a first switch $S_{1A}$ and to REF B through a second switch $S_{1B}$. Each switch is preferably implemented with an NMOS and PMOS transistor pair connected in parallel; the gates of the PMOS transistor for $S_{1A}$ and NMOS transistor for $S_{1B}$ are connected to the output of inverter $INV_{1-i}$, while the gates of the other transistors in $S_{1A}$ and $S_{1B}$ are connected in common to the output of $INV_{1-2}$. In this way one of the switches $S_{1A}$ and $S_{1B}$ is open and the other is closed, depending upon the signal on decoder output line $\mathbf{30}_1$. With switch $S_{1A}$ ON and $S_{1B}$ OFF, the 2R resistor $\mathbf{32}_1$ is connected to REF A, and the bit contributes a voltage value of REF A/4 to the DAC output at terminal 14. If, on the other hand, the decoder signal causes switch $S_{18}$ to close and switch $S_{1A}$ to open, the 2R resistor $\mathbf{32}_1$ is connected to REF B. This results in a zero voltage contribution to the DAC output when REF B is at ground, and a negative contribution when REF B has a negative value.

The remaining bit stages are implemented in a manner similar to the second MSB stage 22. Stage 24 is shown with its decoder control line $\mathbf{30}_2$ connected through series inverters $INV_{2-1}$ and $INV_{2-2}$, with its 2R resistor $\mathbf{32}_2$ connected to REF A and REF B through switches $S_{2A}$ and $S_{2B}$, respectively. Similarly, the LSB 26 has series inverters $INV_{n-1}$ and $INV_{n-2}$ connected to the decoder control line $\mathbf{30}_n$, with its 2R resistor $\mathbf{32}_n$ connectable to REF A and REF B, respectively through switches $S_{nA}$ and $S_{nB}$. Bit 24 contributes a voltage of REF A/8 to the DAC output when switch $S_{2A}$ is ON, while bit 26 contributes a voltage of REF $A/2^{n+1}$ when switch $S_{nA}$ is ON.

The dummy MSB 20 includes a single switch $S_0$, implemented in the same manner as the other bit switches, between its 2R resistor [320] $32_0$ and REF B. A pair of series connected inverters $INV_{0-1}$ and $INV_{0-2}$ are connected at their input end to REF B (as opposed to the inverter pair for the other bits, which receive respective inputs from decoder 28), and have their outputs connected to switch $S_0$ so as to hold the switch permanently ON. This connects the bit's 2R resistor $\mathbf{32}_0$ to REF B, which is typically grounded, and thus holds the bit 20 continually OFF. Since only one of the switches in the switch pairs for each of the other bits will be on at any given time, the dummy bit 20 is impedance matched in terms of both its R-2R resistors and its switch resistance to the rest of the DAC.

If the 2R resistor of each bit stage (including the MSB 20) were connected to REF A, the DAC output at terminal 14 would be $$\text{REF A}\frac{2N-1}{2N}$$

(the ladder termination resistor reduces the output by the value of the LSB). When any of the branch 2R resistors are connected to ground, the net output voltage is decremented in accordance with the bit order of the grounded resistors. For example, connecting the MSB 2R resistor [320] $32_0$ to ground reduces the DAC output by ½, connecting the next MSB 2R resistor $\mathbf{32}_1$ to ground reduces the output by ¼, and so forth. With the MSB 2R resistor $\mathbf{32}_0$ permanently connected to REF B as shown in FIG. 5, the DAC output can never exceed REF A/2. This is compatible with the input voltage restrictions for the op amp A2, which as described above is connected in a multiplier configuration to provide a full output swing capability from REF B up to REF A.

It is desirable that the input impedance of the feedback network for op amp A2, as seen from the op amp's inverting terminal, equal the DAC output impedance; this will provide input bias current cancellation for the op amp. To achieve this impedance matching, the op amp's feedback and gain control resistors 36 and 38 each have a resistance value R, equal to the resistance values of the series resistors in the DAC. Another resistor 40 with a value of R/2 is connected between the op amp's inverting input and the junction of resistors 36 and 38. The input impedance for this resistor network is the resistance of resistor 40 in series with the parallel combination of resistors 36 and 38, for a net input impedance of R; this is the same as the DAC's R-2R output impedance seen from output node 14. To complete the impedance matching, a switch 42 is connected in series with resistor 40. Switch 42 is implemented in the same manner as each of the DAC switches and is held always ON in a manner similar to switch SO in the dummy bit 20. The resistance of switch 42 thus matches the net switch resistance that is included in the DAC's output impedance. Resistor 38 and switch 42 do not alter the op amp's gain.

While particular embodiments of the invention have been shown and described, numerous variations and alternate embodiments will occur to those skilled in the art. Accordingly, it is intended that the invention be limited only in terms of the appended claims.

I claim:

1. A digital-to-analog converter (DAC) drive circuit, comprising:

a pair of voltage reference nodes for supplying different reference voltage levels, a DAC that is connected to receive an input digital signal, and to be supplied directly by both of said voltage reference nodes at the full reference voltage levels, said DAC having multiple bit positions and including m dummy bits in the most significant of said bit positions, said DAC being connected to receive an n-bit input digital signal and, including said dummy bits, having n+m bits, said dummy bits being continually held OFF, and an amplifier that is connected to receive an analog input from said DAC and to provide a drive output, said amplifier having a permissible input signal range that is less than the full range between said reference voltage levels, said dummy bits reducing the DAC's analog output swing to a range that is within the amplifier's permissible input signal range, said amplifier providing its output with a greater than unity amplification.

2. The DAC drive circuit of claim 1, wherein said amplifier amplifies its input so that its output has a range that extends over substantially the full range between said reference voltage levels.

3. The DAC drive circuit of claim 2, wherein said amplifier amplifies its input signal by a factor that is the inverse of the DAC output swing reduction provided by said dummy bits.

4. The DAC drive circuit of claim 1, wherein m=1.

5. The DAC drive circuit of claim 1, said DAC comprising an R-2R ladder and an associated switching network for connecting each of its n least significant bits (LSBs) respectively to one or the other of said voltage reference nodes, said switching network including respective pairs of switches connected in circuit with an 2R resistor of each of said n LSBs, with one switch of each pair connecting its respective 2R resistor to one of said voltage reference nodes and the other switch of each pair connecting its respective 2R resistor to the other of said voltage reference nodes, and a control network that turns one switch of each pair ON and the other switch of each pair OFF in accordance with said input digital signal, said dummy bits each including a single switch connecting an associated 2R dummy bit resistor to one of said voltage reference nodes that corresponds to an OFF bit output, with said single switch held ON for all digital inputs.

6. The DAC drive circuit of claim 5, said amplifier comprising an operational amplifier having its non-inverting input connected to receive the DAC output and its inverting input connected in a feedback circuit with its output, said feedback circuit having an input impedance that matches the output impedance of said DAC.

7. The DAC drive circuit of claim 6, said op amp feedback circuit comprising first and second resistors connected in series between the amplifier output and the voltage reference node that corresponds to an OFF bit output, and a third resistor and a switch connected in series between the amplifier's inverting input and a juncture of said first and second resistors, said first and second resistors each having a resistance value of R, said third resistor having a resistance value of R/2, and said switch being permanently ON and matching the switches in the DAC's switching network.

8. The DAC drive circuit of claim 1, said amplifier comprising an operational amplifier having its non-inverting input connected to receive the DAC output and its inverting input connected in a feedback circuit with its output, said feedback circuit having an input impedance that matches the output impedance of said DAC.

9. A digital-to-analog converter (DAC) drive circuit, comprising:

high and low reference nodes for supplying high and low reference voltage levels, a DAC that is connected to receive an input digital signal and to produce a corresponding analog output signal with a voltage swing that is limited to the voltage range between said high and low reference voltage levels, divided by a factor D, and an operational amplifier supplied with power from said high and low voltage reference nodes, said amplifier having a permissible input signal range that is less than the difference between said high and low reference voltages, said amplifier being connected to amplify its input by said factor D, and thereby produce an amplified output that can swing substantially through the full range between said high and low reference voltage, said amplifier having its non-inverting input connected to receive the DAC output and its inverting input connected in a feedback circuit with its output, said feedback circuit having an input impedance that matches the output impedance of said DAC.

10. The DAC drive circuit of claim 9, said divider comprising an attenuation network that is impedance matched to the DAC.

11. The DAC drive circuit of claim 10, wherein said attenuation network is implemented as m dummy bits in the most significant bit positions of said DAC, said DAC being connected to receive an n-bit input digital signal and, including said dummy bits, having n+m bits, said dummy bits being held OFF.

12. A digital-to-analog converter (DAC) drive circuit, comprising:

a DAC that is connected to receive an input digital signal and to produce a corresponding analog output signal with a predetermined swing range, an operational amplifier that is connected to receive an analog input from said DAC and to provide a drive output, said amplifier having a permissible input signal range that is less than the DAC's analog output signal swing range, and a divider that is connected to reduce the DAC's analog output swing to a range that is within the amplifier's permissible input signal range, said amplifier receiving its input from said DAC through said divider and providing its output with a greater than unity amplification, said amplifier having its non-inverting input connected to receive the DAC output and its inverting input connected in a feedback circuit with its output, said feedback circuit having an input impedance that matches the output impedance of said DAC.

13. The DAC drive circuit of claim 12, wherein said amplifier amplifies its input so that its output has a range that extends over substantially the full swing range of the DAC's analog output signal.

14. The DAC drive circuit of claim 13, wherein said amplifier amplifies its input signal by a factor that is the inverse of the DAC output swing reduction provided by said divider.

15. The DAC drive circuit of claim 12, wherein said divider reduces the DAC's analog output swing by half, and said amplifier amplifies its input signal by two.

16. The DAC drive circuit of claim 15, said divider comprising an attenuation [circuit] *network* that is impedance matched to the DAC.

17. The DAC drive circuit of claim [15], *16*, wherein said attenuation network is implemented as a dummy bit in the most significant bit position of said DAC, said DAC being connected to receive an n-bit input digital signal and, including said bit, having n+1 bits, said dummy bit being held OFF.

18. The DAC [drive] circuit of claim 12, said divider comprising an attenuation network that is impedance matched to the DAC.

19. The DAC drive circuit of claim 18, wherein said attenuation network is implemented as m dummy bits in the most significant bit positions of said DAC, said DAC being connected to receive an n-bit input digital signal and, including said dummy bits, having n+m bits, said dummy bits being held OFF.

20. A digital-to-analog converter (DAC) drive circuit, comprising:

a pair of voltage reference nodes for supplying different reference voltage levels, a DAC that is connected to receive an input digital signal, and to be supplied by said voltage reference nodes, an amplifier that is connected to receive an analog input from said DAC and to provide a drive output, said amplifier having a permissible input signal range that is less than the full range between said reference voltage levels, and a divider that is connected to reduce the DAC's analog output swing to a range that is within the amplifier's permissible input signal range, said amplifier receiving its input from said DAC through said divider, and providing its output with a greater than unity amplification, said divider comprising an attenuation network that is impedance matched to the DAC, said attenuation network implemented as m dummy bits in the most significant bit positions of said DAC, said DAC being connected to receive an n-bit input digital signal and, including said dummy bits, having n+m bits, said dummy bits being continually held OFF, said DAC comprising an R-2R ladder and an associated switching network for connecting each of its n least significant bits (LSBs) respectively to one or the other of said voltage reference nodes, said switching network including respective pairs of switches connected in circuit with an 2R resistor of each of said n LSBs, with one switch of each pair connecting its respective 2R resistor to one of said voltage reference nodes and the other switch of each pair connecting its respective 2R resistor to the other of said voltage reference nodes, and a control network that turns one switch of each pair ON and the other switch of each pair OFF in accordance with said input digital signal, said dummy bits each including a single switch connecting an associated 2R dummy bit resistor to one of said voltage reference nodes that corresponds to an OFF bit output, with said single switch held ON for all digital inputs, said amplifier comprising an operational amplifier having its non-inverting input connected to receive the DAC output and its inverting input connected in a feedback circuit with its output, said feedback circuit having an input impedance that matches the output impedance of said DAC.

21. The DAC drive circuit of claim 20, said op amp feedback circuit comprising first and second resistors connected in series between the amplifier output and the voltage reference node that corresponds to an OFF bit output, and a third resistor and a switch connected in series between the amplifier's inverting input and a juncture of said first and second resistors, said first and second resistors each having a resistance value of R, said third resistor having a resistance value of R/2, and said switch being permanently ON and matching the switches in the DAC's switching network.

22. A digital-to-analog converter (DAC) drive circuit, comprising:

a pair of voltage reference nodes for supplying different reference voltage levels, a DAC that is connected to receive an input digital signal, and to be supplied by said voltage reference nodes, an amplifier that is connected to receive a analog input from said DAC and to provide a drive output, said amplifier having a permissible input signal range that is less than the full range between said reference voltage levels, and a divider that is connected to reduce the DAC's analog output swing to a range that is within the amplifier's permissible input signal range, said amplifier receiving its input from said DAC through said divider and providing its output with a greater than unity amplification, said amplifier comprising an operational amplifier having its non-inverting input connected to receive the DAC output and its inverting input connected in a feedback circuit with its output, said feedback circuit having an input impedance that matches the output impedance of said DAC.

23. The DAC drive circuit of claim 22, wherein said amplifier amplifies its input so that its output has a range that extends over substantially the full range between said reference voltage levels.

24. The DAC drive circuit of claim 23, wherein said amplifier amplifies its input signal by a factor that is the inverse of the DAC output swing reduction provided by said divider.

25. The DAC drive circuit of claim 22, wherein said divider reduces the DAC's analog output swing by half, and said amplifier amplifies its input signal by two.

26. The DAC drive circuit of claim 25, said divider comprising an attenuation network that is impedance matched to the DAC.

*27. A digital-to-analog converter (DAC) drive circuit, comprising:*

*a pair of voltage reference nodes for supplying different reference voltage levels,*

*a DAC that includes a conversion section connected to receive a digital input signal and convert the digital signal to an analog output signal, and an attenuation section, said DAC connected to be supplied directly by both of said voltage reference nodes at the full reference voltage levels, and*

*an amplifier having an input that is connected to receive the analog output from said DAC and to provide a drive output, said amplifier having a permissible input signal range that is less than the full range between said reference voltage levels, and a greater than unity amplification;*

*said attenuation section connected to said DAC conversion section to reduce the DAC's analog output swing to a range that is within the amplifier's permissible input signal range.*

*28. The DAC drive circuit of claim 27, wherein said attenuation section includes an attenuation network.*

*29. The DAC drive circuit of claim 27, wherein said DAC is connected to be supplied directly by both of said voltage reference nodes at the full reference voltage levels.*

*30. The DAC drive circuit of claim 27, wherein said digital input is connected only to said conversion section.*

*31. The DAC drive circuit of claim 27, said conversion section comprising multiple DAC bits and said attenuation section comprising at least one DAC bit, with only the multiple DAC bits of the conversion section having associated therewith switches controlled by said input digital signal.*

*32. The DAC drive circuit of claim 27, wherein said amplifier amplifies its input so that its output has a range that extends over substantially the full range between said reference voltage levels.*

*33. The DAC drive circuit of claim 32, wherein said amplifier amplifies its input signal by a factor that is the inverse of a DAC output swing reduction factor.*

*34. A digital-to-analog converter (DAC) drive circuit, comprising:*

*a pair of voltage reference nodes for supplying different reference voltage levels,*

*a DAC that is connected to receive an input digital signal, and to be supplied directly by both of said voltage reference nodes at the full reference voltage levels, and*

*an amplifier that is connected to receive an analog input from said DAC and to provide a drive output, said amplifier having a permissible input signal range that is less than the full range between said reference voltage levels,*

*said DAC including an attenuation portion that reduces the DAC's analog output swing to a range that is within the amplifier's permissible input signal range, said amplifier providing its output with a greater than unity amplification.*

*35. The DAC drive circuit of claim 34, wherein said attenuation portion includes an attenuation network.*

*36. The DAC drive circuit of claim 34, wherein said attenuation portion is not connected to receive said input digital signal.*

*37. The DAC drive circuit of claim 34, wherein said amplifier amplifies its input so that its output has a range that extends over substantially the full range between said reference voltage levels.*

*38. A digital-to-analog converter (DAC) drive circuit, comprising:*

*high and low reference nodes for supplying high and low reference voltage levels,*

*a DAC that is connected to receive the full voltage differential between said reference nodes and an input digital signal, and to produce a corresponding analog output signal with a voltage swing that is limited to the voltage range between said high and low reference voltage levels divided by a factor D, and*

*an operational amplifier supplied with power from said high and low voltage reference nodes, said amplifier having a permissible input signal range that is less than the difference between said high and low reference voltages, said amplifier connected to amplify its input by said factor D, and thereby produce an amplified output that can swing substantially through th e full range between said high and low reference voltage levels.*

*39. The DAC drive circuit of claim 38, said DAC comprising a conversion section connected to receive said input digital signal and convert it to said analog output signal, and an attenuation section that is connected to said DAC conversion section to reduce the DAC's analog output swing by said factor D.*

*40. The DAC drive circuit of claim 39, wherein said attenuation section includes an attenuation network.*

*41. The DAC drive circuit of claim 39, wherein said digital input is connected only to said conversion section.*

*42. The DAC drive circuit of claim 39, said conversion section comprising multiple DAC bits and said attenuation section comprising at least one DAC bit with only the multiple DAC bits of the conversion section having associated therewith switches controlled by said input digital signal.*

* * * * *